United States Patent
Turena et al.

(10) Patent No.: US 10,938,212 B2
(45) Date of Patent: Mar. 2, 2021

(54) DEVICE FOR OPTIMIZING PRODUCTION, CONSUMPTION, AND STORAGE OF ELECTRIC ENERGY

(71) Applicant: CESKA ENERGETICKO-AUDITORSKA SPOLECNOST, S.R.O., Prague (CZ)

(72) Inventors: Milan Turena, Dasice (CZ); Ludvik Dolecek, Dasice (CZ); Jaroslav Stasek, Dolni Roven (CZ)

(73) Assignee: CESKA ENERGETICKO-AUDITORSKA SPOLECNOST, S. R. O., Prague (CZ)

( * ) Notice: Subject to any disclaimer, the term of this patent is extended or adjusted under 35 U.S.C. 154(b) by 0 days.

(21) Appl. No.: 16/604,500

(22) PCT Filed: Apr. 4, 2018

(86) PCT No.: PCT/CZ2018/050016
§ 371 (c)(1),
(2) Date: Oct. 10, 2019

(87) PCT Pub. No.: WO2018/188678
PCT Pub. Date: Oct. 18, 2018

(65) Prior Publication Data
US 2020/0059099 A1 Feb. 20, 2020

(30) Foreign Application Priority Data
Apr. 10, 2017 (CZ) .................... CZ2017-200

(51) Int. Cl.
*H02J 3/32* (2006.01)
*H02S 40/32* (2014.01)
(Continued)

(52) U.S. Cl.
CPC ............... *H02J 3/32* (2013.01); *G05B 19/05* (2013.01); *H02J 3/383* (2013.01); *H02J 7/35* (2013.01);
(Continued)

(58) Field of Classification Search
CPC ......... H01L 31/05; H02S 40/44; H02S 50/00; G05B 11/01; G05B 19/05;
(Continued)

(56) References Cited

U.S. PATENT DOCUMENTS

2008/0147335 A1 6/2008 Adest
2009/0189456 A1 7/2009 Skutt
(Continued)

FOREIGN PATENT DOCUMENTS

AU 2011264442 1/2013
CN 201639515 11/2010
(Continued)

OTHER PUBLICATIONS

Chandrasekar, V., Chacko Renji V.; Lakarampil Z. V.: Design and Implementation of an energy efficient power conditioner for fuel cell generation system, Oct. 18, 2011, International Journal of Hydrogen Energy, 36(22), pp. 15009-15017 ISSN: 0360-3199.
(Continued)

*Primary Examiner* — Jared Fureman
*Assistant Examiner* — Duc M Pham
(74) *Attorney, Agent, or Firm* — Riverside Law LLP

(57) ABSTRACT

The device includes an electric energy source to which an inverter is power-connected, whose output is three-phase with symmetrical power distribution. It further includes an inter-phase power transfer module which is power-connected to the inverter and comprises at least one first power board including at least three power transistors. The inter-phase power transfer module has a data interface and has a
(Continued)

first output with asymmetrical power distribution into three phases, wherein the first output is further connected to a distinctive nodal point, this distinctive nodal point being power-connected to a load. Through a measuring module, the PLC control system is also connected to the distinctive nodal point, the PLC control system being further connected also to the inverter and the data interface. This arrangement ensures that the power supplied to the load reflects in each phase the power consumed by the load. The device further offers additional possibilities to control energy production, consumption and storage.

11 Claims, 1 Drawing Sheet

(51) Int. Cl.
*H02S 40/38* (2014.01)
*G05B 19/05* (2006.01)
*H02J 3/38* (2006.01)
*H02J 7/35* (2006.01)

(52) U.S. Cl.
CPC .............. *H02S 40/32* (2014.12); *H02S 40/38* (2014.12); *G05B 2219/15097* (2013.01); *G05B 2219/15121* (2013.01)

(58) Field of Classification Search
CPC . G05B 2219/15097; G05B 6/02; H02J 3/381; H02J 2300/24; H02J 3/32; H02J 3/383; H02J 7/35; Y02E 10/60; G05F 1/66
See application file for complete search history.

(56) References Cited

U.S. PATENT DOCUMENTS

| | | | |
|---|---|---|---|
| 2013/0038993 A1 | 2/2013 | Dorfer | |
| 2013/0297084 A1* | 11/2013 | Kubota | H02J 3/32 700/286 |
| 2014/0217983 A1* | 8/2014 | McCalmont | H02J 3/383 320/128 |
| 2015/0316901 A1* | 11/2015 | Wenzel | G06Q 10/06 700/291 |
| 2016/0232623 A1* | 8/2016 | Parks | G05F 1/66 |
| 2016/0236634 A1* | 8/2016 | Parks | G05F 1/66 |
| 2016/0352325 A1 | 12/2016 | Chen | |
| 2017/0149250 A1* | 5/2017 | Shuy | H02S 40/38 |

FOREIGN PATENT DOCUMENTS

| | | |
|---|---|---|
| CN | 205992797 | 3/2017 |
| CZ | 305568 | 12/2015 |
| CZ | 306041 | 7/2016 |
| CZ | 30775 U1 | 6/2017 |
| EP | 2325970 | 5/2011 |
| EP | 3124878 | 2/2017 |
| WO | 2011153564 | 12/2011 |
| WO | 2012101911 | 8/2012 |
| WO | 2014133521 | 9/2014 |

OTHER PUBLICATIONS

Ellsworth D., Malony A., Rountree B., Schulz M., "Dynamic Power Sharing for Higher Job Throughput", Jul. 23, 2015; LLNL-CONF-675184, 13 pages.

* cited by examiner

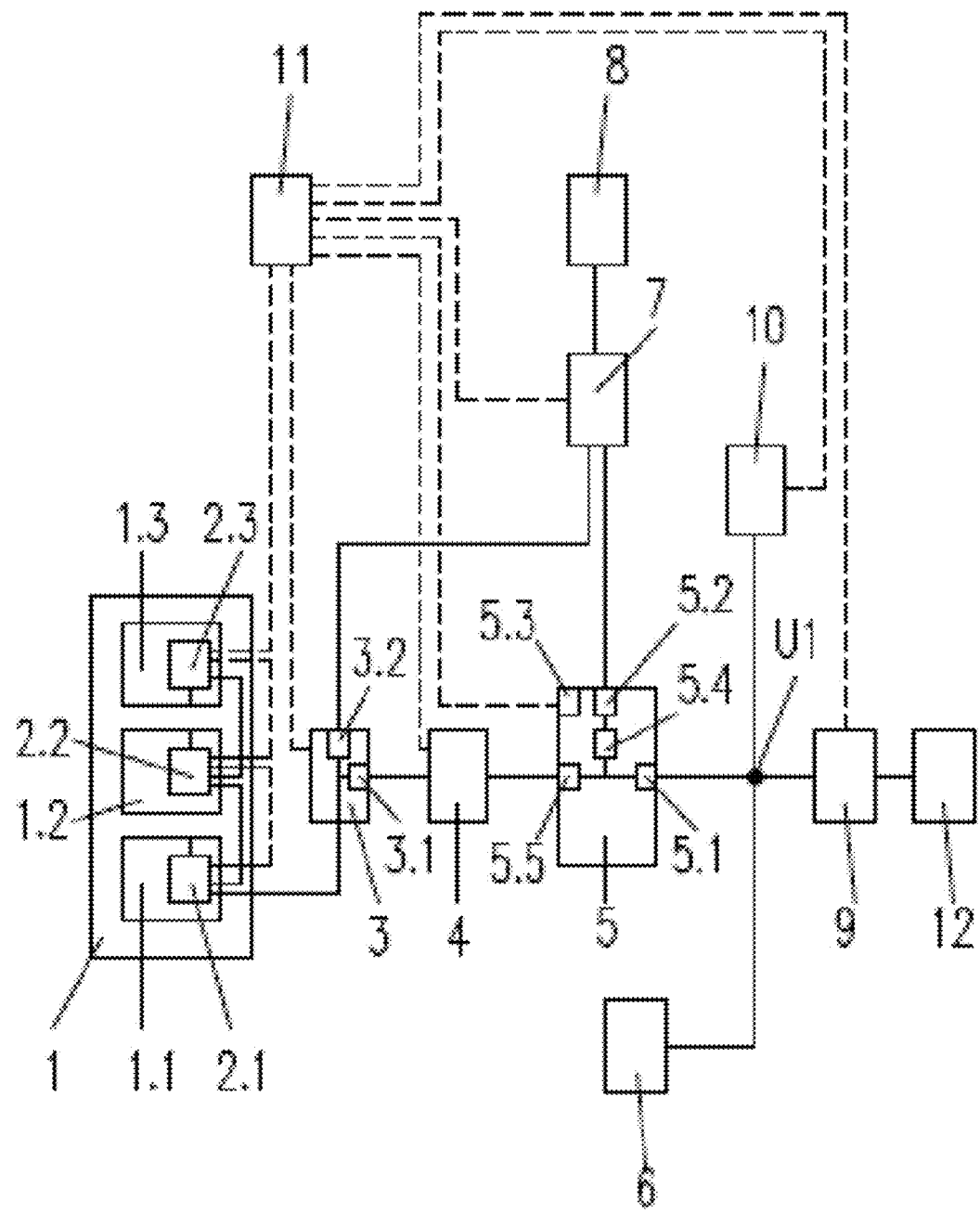

DEVICE FOR OPTIMIZING PRODUCTION, CONSUMPTION, AND STORAGE OF ELECTRIC ENERGY

CROSS-REFERENCE TO RELATED APPLICATIONS

This application is a national stage filing of International Application No. PCT/CZ2018/050016 filed on Apr. 4, 2018 which claims priority to Czech Republic patent application no. CZ20170000200 filed on Apr. 10, 2017, both of which are incorporated herein by reference in their entireties.

TECHNICAL FIELD

The present invention, which is a device for optimizing the production, consumption, and storage of electric energy from sources generating energy independently of the distribution grid, allows for complete or partial independence of the connected consumer point or points of the electric energy distribution grid, with maximum utilization of self-produced energy. The power delivered to the load in each of the three phases L1, L2, L3 is optimized and reflects the consumption used by the load in each of these phases. The device can work utilizing the distribution grid and also in the event of its failure. Its objective is to maximize the utilization of own energy produced (in photovoltaic power plants it can utilize up to 70% of the energy produced compared to the conventional photovoltaic power plants, wherein the common utilization is 30%) and especially energy independence of the distribution grid. For example, in case of a distribution grid failure, the system switches to energy supply from battery modules. However, the options of controlling the production, consumption and energy storage are far wider and very complex.

BACKGROUND ART

In power plants using sources generating energy independently of the distribution grid, and particularly in power plants with renewable energy sources, a wide spectrum of problems related to the production control and management of the energy produced needs to be dealt with. For example, often it is important to utilize maximum of the produced power at the connected consumer site so that there is no need to feed the generated surplus into the distribution grid. The surplus potentially to be consumed at the site often arises, for example, due to the uneven consumption of the produced power in the individual phases in a situation, where the source delivers power evenly distributed in all three phases L1, L2, L3, L1, where L1, L2, L3 is the common electrical labeling of phases in electrical engineering. Then, for example, a situation may arise, where the load on L1 consumes more power than the power supplied from the source, and must therefore draw the missing part of the power from the distribution grid or a backup source. However, it is possible that concurrently the consumption of the load, for example in phases L2 and L3, is conversely lower than the produced power in these phases, and the excess produced power in the two phases is then fed to the distribution grid, which is often ineffective and disadvantageous for the device operator.

One common solution is described e.g. in FIG. 1 in the patent application US20130038993 of the company Fronius. The system comprises an alternative electric energy source, an inverter connected thereto, which comprises an input DC/DC converter and an output DC/AC converter, the output of the inverter being connected to a public or private distribution grid and an electric load.

On the inverter output the power is thereby split into phases L1, L2, L3 in a uniform manner, uniform distribution of power to phases L1, L2, L3 is thus also on the load input, irrespective of the fact that power in different phases L1, L2 L3 is consumed unevenly.

The company Fronius offers commercially available systems for solar power plants, such as the Fronius Hybrid system, whose technical documentation is available at: https://www.fronius.com/cps/rde/xbcr/SID-22D54973-56647F95/fronius_international/
1235402_snapshot_42_0426_0209_EN.pdf. Even this system does not solve the above-mentioned problem of uneven consumption of energy in phases L1, L2 and L3.

Additionally, the Fronius Hybrid system does not enable to perform other operations important for the efficient operation of a photovoltaic power plant. For example, the source photovoltaic panels are insufficiently regulated, and their regulation is not individual, a failure or a functional deterioration of one of them thus affects the performance of the entire system. The power measurement in the single phases L1, L2, L3 is summary, i.e. it does not reflect the uneven distribution of power to the phases L1, L2, L3, and additionally it has a slow response. The surplus energy storage management into the batteries is applied to the entire battery bank comprising a set of battery modules, i.e. the modules may not be controlled individually, which makes storage less energy efficient, additionally, it is not possible to monitor each individual battery module and the system is thus sensitive to failures. The Fronius Hybrid system also does not provide for other surplus energy storage than the batteries. It lacks a communication interface that would enable a system connection to other devices, such as a heat pump, air conditioning, heat recovery units, electric vehicle charging station. Also, it is not equipped with a wireless interface that would allow remote switching of resistive appliances, such as boilers, heating ladders, storage heaters, hot water storage tanks and other. The possibility of a reliable central disconnection of the photovoltaic system in an emergency, such as in case of fire, is missing. Another disadvantage is that external discharging of the battery bank to the distribution board of a distribution grid occurs.

Another device by the Green Bono company also exists, whose documentation is available for example from http://www.yorix.cz/cz/greenbono/greenbono.htm. This device measures power in individual phases, but it is only for the purpose of storage of surplus energy in heat storage tanks. The measuring module used for this power measurement is very simple, has no microprocessor, does not measure apparent and reactive power, power factor cos φ. The measurement is inaccurate and the response slow. Upon detection of surplus power in one of the phases L1, L2, L3, the control elements become active, redirecting the excess power to the heat storage tanks. The output from the inverter and also the input to the load, wherein load means the other electrical appliances, has power distribution symmetrical for phases L1, L2, L3, and the system therefore does not effectively respond to the generally varying energy consumption in these phases by the connected appliances.

Similarly to the Fronius Hybrid device, also here the source photovoltaic panels are insufficiently regulated, and their regulation is not individual, in the event of a failure or a functional deterioration of one of them, the functionality of the entire system is influenced. It lacks the possibility to store surplus energy into a battery bank with battery modules.

Similarly to the Fronius Hybrid device, also here a communication interface that would enable system connection to other devices, such as heat pump, air conditioning, heat recovery units, and electric vehicle charging station, is missing. The GreenBono device is not equipped with a wireless interface that would allow remote switching of resistive appliances. The possibility of a reliable central disconnection of the photovoltaic system in an emergency, such as in case fire, is missing. The possibility of limiting the active power is missing.

SUMMARY OF INVENTION

These disadvantages are eliminated by the device for optimizing production, storage and consumption of electric energy from renewable energy sources or conventional fuel sources generating electric energy independently of the distribution grid. One of the significant features of the device is that, unlike the current technical solutions, a new element is inserted between the inverter and the load, which is the inter-phase power transfer module. The device further provides, among other, sophisticated individual control options for the battery modules, and a complex system for the effective management of energy production from renewable sources and its use.

The device according to the present invention includes a source of electric energy to which a hybrid or grid inverter is power-connected by its input, whose output is three-phase with symmetrical power distribution uniform in all three phases. A load is connected to the device. The device also includes a measuring module for measuring supplied power and power consumed by the load, while the supplied and consumed power measurements are performed in each of the three phases separately. The principle of the device is that it includes the inter-phase power transfer module and a Programmable Logic Controller system (hereinafter denoted as PLC control system). The inter-phase power transfer module is directly or by means of other components power-connected to the inverter output, a principal feature being also that it comprises at least one first power board including at least three power transistors for controlling the power. At least one power transistor is installed in each of the three phases. The inter-phase power transfer module has a data interface and has the first output with asymmetrical power distribution into the three phases. This first output is additionally interconnected with a distinctive nodal point, this distinctive nodal point being power-connected to the load. The distinctive nodal point is also power-connected to the measuring module, this measuring module being further data-connected to the PLC control system. The PLC control system is additionally also data-connected in one additional branch to the data interface of the inter-phase power transfer module. In the second additional branch, the PLC control system is interconnected to the inverter.

It is advantageous, if the power transistors used in the first power board of the inter-phase power transfer module are the power bipolar transistors with an insulated gate. Hereinafter, these transistors will be designated by the abbreviation IGBT (Insulated Gate Bipolar Transistor).

It is advantageous, if the device further comprises also at least one battery module to which at least one battery control block is connected upstream. The inter-phase power transfer module has for this purpose a second output to which an AC/DC converter is connected upstream, and this second output is power-connected by means of the battery control block to the battery module. AC is a common abbreviation for alternating current and DC is a common abbreviation for direct current. The battery control block is additionally data-connected to the PLC control system.

It is advantageous if the battery control block comprises an active balancer including a second power board with installed power transistors, a coupling transformer, power ballast, switching mode supply, measurement circuits for measuring the current, voltage, insulation, and temperature, and a battery communication module for communication with the PLC control system and recording of battery module data.

In some advantageous embodiments, the device also comprises also a DC/DC converter for disconnecting power and for controlling the electric energy source power and for transforming the voltage from the source. The DC/DC converter is inserted in the circuit between the electric energy source and the inverter and is power interconnected with them. Additionally, this DC/DC converter also is data-connected to the PLC control system.

If the device includes a battery control block, it is advantageous if the DC/DC converter is power-connected to the battery control block.

In one possible configuration of the invention, the device for optimizing the production, storage and consumption of electric energy is power-connected to the distribution board of a distribution grid, the interconnection being implemented through a distinctive nodal point.

In one possible configuration of the invention, the electric energy source comprises at least one photovoltaic panel.

It is advantageous if each photovoltaic panel has a dedicated power optimizer installed for individual status monitoring and/or power control and/or disconnection of the respective photovoltaic panel in case of damage or fire. Each of these power optimizers is also data-connected to the PLC control system 11.

One advantageous configuration of the invention also comprises a thermal energy accumulation equipment, which is power-connected to the distinctive nodal point and is data-connected to the PLC control system.

Other advantages of the invention will be apparent from the Examples of Preferred Embodiments.

BRIEF DESCRIPTION OF DRAWINGS

FIG. 1 is a block diagram of the device in one possible embodiment of the present invention.

DESCRIPTION OF PREFERRED EMBODIMENTS

FIG. 1 shows one possible version of the device according to the present invention. The interconnection between the blocks is shown schematically, the solid line represents a power interconnection, the dashed line represents data interconnection. The power interconnection is generally three-phase, the data interconnection represents a line or wireless interconnection serving primarily for data transmission. A power interconnection of two blocks means that the blocks are interconnected by power electrical connection in the common electrical engineering sense, however, this may not be just a direct interconnection, other components or parts of the circuit may be inserted between the two given blocks. The term power interconnection or connection or link therefore means both a direct interconnection and also an interconnection through other components, and comprises both single-phase and three-phase interconnection.

Data interconnection, connection or link also comprises interconnection, connection, and also interconnection by means of other inserted elements. An exemplary configuration in FIG. 1 shows a setup where the electric energy source 1 consists of solar panels. Other options are possible using other types of electric energy sources 1, these may be renewable sources and also conventional fuel sources that can supply power independently of the distribution grid. As an example, these are e.g. devices using wind or water power, microgeneration or a diesel generator or a combination of these sources.

In one preferred embodiment shown in FIG. 1, there is an AC three-phase power interconnection between the inverter 4 and the inter-phase power transfer module 5, which continues through its first output 5.1 also to the distinctive nodal point U1. An AC three-phase power interconnection is also further on the connecting lines between the distinctive nodal point U1, load 6, measuring module 9 and thermal energy accumulation equipment 10. The connection to the distribution board 12 of a distribution grid is also three-phase.

In the exemplary configuration demonstrated in FIG. 1, a DC power interconnection is between the photovoltaic panels 1.1, 1.2, 1.3, the power optimizers 2.1, 2.2, 2.3, and the input of the inverter 4. A DC power interconnection is also between the second output 5.2 of the inter-phase power transfer module 5, the battery control block 7 and the battery module 8.

The configurations described herein show only some of many possible solutions falling under the invention protection and illustrate the concept of the invention. These are only the selected preferred configurations that do not limit the scope of the invention protection in any way. More components may be inserted between the individual device blocks, especially e.g. various disconnectors, switches, breakers, etc., that however, do not alter the essential features of the device according to the present invention.

FIG. 1 demonstrates an example of an embodiment, wherein the source consists of the photovoltaic panels 1.1, 1.2, 1.3, and the electric power source 1 interconnection to the other circuit elements is made by the optimizers 2.1, 2.2, 2.3 connected to the photovoltaic panels 1.1, 1.2, 1.3. For other source types than demonstrated in FIG. 1, the electric power source 1 interconnection with the other circuit elements, e.g. the DC/DC converter 3 or the inverter 4 would be more direct, without the optimizers.

The device provides a complex and compact solution for optimizing the production, consumption and storage of electric energy from a source generating electric power independently of the distribution grid and for controlled storage of surplus electric energy produced either into batteries or in a thermal energy accumulating equipment, with subsequent controlled phased consumption of the surplus.

An appliance or a set of appliances that draw energy generated by the electric power source 1, will be referred to hereinafter, for brevity, as a load 6. For the designation of the phases, we will use the standard marking used in electrical engineering, namely L1, L2, and L3.

In the device circuit, as demonstrated in FIG. 1, the electric power source 1 is power-connected to the inverter 4, which is a standard solution. This inverter 4 may be either grid, thus requiring a connection to the distribution board 12 of a distribution grid, or hybrid, i.e. such that may function without this connection in the so-called island mode, i.e. in an off the grid mode. By distribution grid we mean a public or private electricity grid. The inverter 4 converts DC voltage from the electric power source 1 or from its downstream DC/DC converter 3 into AC voltage, usually 3×230 V/400 V, using semiconductor elements. The output of the inverter 4 is thus three-phase and has a symmetric power distribution uniform in all three phases L1, L2, L3.

A significant feature of the device is that the inverter 4 output is power-connected directly or by means of additional components to the input of inter-phase power transfer module 5 which comprises at least one first power board 5.5 including at least three power transistors for controlling the power, with at least one power transistor being installed in each of the three phases L1, L2, L3. The total number of power transistors is determined by the power: the greater the power, the more transistors. The power transistors suitable for installation into the first power board 5.5 are in this case the power IGBT transistors, which are the most suitable, but the device functions also with other types of power transistors, such as BJT (Bipolar Junction Transistor) or MOSFET (Metal Oxide Semiconductor Field Effect transistor). In one preferred embodiment, the first power board 5.5 includes three power transistors, each of which is connected separately to one of the three phases, i.e. the first power transistor to phase L1, the second power transistor to phase L2 and the third power transistor to phase L3. The inter-phase power transfer module 5 may also include more of these first power boards 5.5. The inter-phase power transfer module 5 has the first output 5.1, which is identical to the output of the first power boards 5.5.

This first output 5.1 of the inter-phase power transfer module 5 is further power interconnected to the distinctive nodal point U1, said distinctive nodal point U1 being power interconnected also to the load 6.

A measuring module 9 for measuring the supplied power and for individual measuring of the power consumed by the load 6 in each of the phases L1, L2, L3 separately, is also connected in the circuit. Typically, the measuring module 9 is an electronically programmable electricity meter for monitoring consumption and supply of active electric energy. The technical solution basis of the measuring module 9 is a microprocessor which performs the following main functions: converts the analog signal from the current and voltage sensors into a digital format, performs calculations, typically communicates by means of the bus RS485 with the PLC control system 11. The calibration of the measuring module 9 is performed programmatically and the measuring module 9 does not contain any mechanical adjustment elements. The measuring module 9 easily achieves the declared accuracy up to 1% or even better. The measuring module 9 measures both the apparent and reactive power, power factor cos φ, the measurement is accurate and fast.

The measuring module 9 is equipped with an RS485 communication interface. The communication part of the measuring module 9 is galvanically separated from its power part. The measuring module 9 does not require external power supply. This measuring module 9 is power-connected to the distinctive nodal point U1. The measuring module 9 is data interconnected to the PLC control system 11. The inter-phase power transfer module 5 has a data interface 5.3, to which the PLC control system 11 is also data interconnected in one additional branch of the circuit. Hereby an interconnection is achieved of the first output 5.1 of the inter-phase power transfer module 5, load 6 and the measuring module 9, which communicates data with the PLC control system 11, by means of which the data interface 5.3 provides feedback between the load 6 consumption and the inter-phase power transfer module 5. If the consumption in one of the phases decreases, the PLC control system 11 sends to the power transistor or transistors connected to this phase a signal to reduce the power and vice versa, if consumption in one of the phases increases, the PLC control system 11 signals to the power transistor or transistors connected to this phase to increase the power. Because of this arrangement, the power distribution on the first output 5.1 of the inter-phase power transfer module 5 is generally asymmetric, i.e. with a generally different power in each of the phases L1, L2, L3, wherein the power distribution on the first output 5.1 reflects the load 6 consumption. The PLC control system is in the second additional circuit branch also interconnected to the inverter 4, thus providing timely power control. Because of this communication, it is known what is the summary power at the input of the inter-phase power transfer module 5.

The load 6 usually draws power in the individual phases unevenly, e.g. load consumption in L1 can be 750 W, in L2 e.g. 750 W, and in phase L3 e.g. 0 W. Electric energy source 1 is usually connected to the inverter 4, whose output, however, has power distribution uniform in the phases, i.e. the same power in each of the phases.

In a system according to the state of the art, i. e. without the inter-phase power transfer module 5, the system will exhibit an inefficient consumption management, power overflow in some phases and power insufficiencies in other phases on the side of the load 6, even in the case where the total power consumption of the load 6 would be equal to the power supplied on the side of the inverter 4. In this case, using the values from the above example, the supplied power on the side of the inverter 4 will be equal to 750 W+750 W=1500 W, which is equivalent to the total consumption of the load 6. This summary power of 1500 W, which would be sufficient overall to power the load, will, however, be distributed in this example uniformly in all 3 phases at the inverter 4 output, i.e. in phase L1 1500:3=500 W, in phase L2 also 500 W and the same in phase L3. The deficiency for load 6 will therefore be 250 W in the respective phases L1 and L2, and the system without an inserted inter-phase power transfer module 5 will draw this energy from the distribution board 12 of a distribution grid. On the other hand, phase L3 will have a 500 W surplus, and this surplus will in turn be supplied by means of the distribution board 12 to the distribution grid. This management method is very inefficient.

By contrast, the insertion of an inter-phase power transfer module 5 between the load 6 and the inverter 4 and the data communication with the PLC control system 11 ensures that the power in the individual phases at the first output 5.1 of the inter-phase power transfer module 5 will reflect the load 6 consumption, thus in the above present case, the first output 5.1 of inter-phase power transfer module 5 will have 750 W of power in phase L1, 750 W of power in phase L2, and 0 W of power in phase L3. The consumption from the distribution board 12 of the distribution grid will be in this case 0 W.

The device according to the present invention may operate either in an off-grid system without a connection to the distribution grid, or it can be power interconnected to the distribution board 12 of a distribution grid. In the latter case, the power interconnection to the distribution board 12 of the distribution grid is implemented through the distinctive nodal point U1, as shown in FIG. 1.

In systems with renewable energy sources, an imbalance between production and consumption of electric energy usually occurs. It is not always optimal or possible to feed the excess energy into the distribution grid. On the other hand, the insufficiency of produced energy resulting from a momentary lower power of the alternative source could cause an outage of the connected appliances. For all these reasons, at least one battery module 8 is added to the device, said battery module being equipped with at least one upstream battery control block 7. By battery module 8 we mean one battery or one battery cell. To connect the battery modules 8, the inter-phase power transfer module 5 also has a second output 5.2, to which an AC/DC converter 5.4 is connected upstream. This second output 5.2 is power interconnected by means of the battery control block 7 to the battery module 8, the battery control block 7 being additionally data interconnected to the PLC control system 11. For multiple battery modules 8, each of them is equipped by its own battery control block 7 and each of the control blocks 7 is data-connected to the PLC control system 11. The number of the battery modules 8 is determined by the total capacity. In the most common invention embodiments of the invention, the number of battery modules 8 ranges from 1 to 6.

The battery module 8 is an off-the-shelf product. The main condition for the correct selection of the battery module 8 is that it enables multi-point temperature measurements (at least 4 points), has a sufficient capacity and a higher voltage limit.

On the other hand, the battery control block 7 represents a new solution, and in a preferred embodiment comprises an active balancer including a second power board with installed power transistors, a coupling transformer, power ballast, switching mode supply, measuring circuits for current measurement, voltage, insulation and temperature, and a communication module for connection to the PLC control system 11. All the data about the battery module 8 are sent from the balancer to the PLC control system 11 and are recorded. In one preferred embodiment, IGBT transistors are used as the power transistors in the balancer, however, other types of power transistors may be used.

The device reaction time is short, and the balancing is thus fast.

One of the possibly used battery types are the LiFePO4 type batteries that can be balanced only in approximately the last 5% of the charging process, the balancing speed associated with the magnitude of the balancing current is thus gaining fundamentally in importance.

The balancer contained in the battery control block 7 represents precise protection and highly advanced diagnostics of the battery module 8. It monitors all important parameters of the battery module 8, communicates with the superordinate PLC control system 11 and stores the relevant information together with the real time. It is thus possible to retrospectively identify exactly what and at what time happened to a specific battery module 8. This is an invaluable tool for diagnosing various non-conformances, improper handling of the battery module 8, or an occurrence of a defective battery module 8 and its subsequent replacement claim. In a completely unique way it provides a measurement of the power element temperature, so that overheating and destruction is completely eliminated. It is therefore an excellent system, full of innovative technologies and algorithms. The main principle is the power flow between arbitrary battery modules 8, and the fact that the battery banks of battery modules 8 are controlled at the level of the individual battery modules 8 in such manner, that the entire bank can be charged and discharged in the range of 0-100% of capacity of each single battery module 8, even though the difference in capacities between the individual cells is e.g. 20%.

For a proper balancer design, an approximate determination is needed of what is the limiting decrease in the capacity of one battery module 8 so that it is categorized as a weak cell intended for replacement, but temporarily left in operation. Even in this state the battery module bank 8 could remain in operation, but its overall power would be already partially limited by the capacity of the weakest cell.

In summary, the balancer balances with high currents, provides unique care and extended lifetime of the battery systems. This represents a substantial economic benefit.

As a result of this original manner of interconnection and control, a potentially weaker battery module 8 may independently pass to a switched off mode, the so-called emergency stop, or charging, the other battery modules 8 still being in the discharge mode. It is also possible to charge the battery modules 8 only partially in a controlled manner and not to fully charge them, and if needed, changed to the discharge mode. It is also possible to disconnect some of the battery modules 8 diagnosed as defective from the battery module 8 bank, without affecting the function of the rest of the battery bank. All the diagnostics, measurements, controlled disconnections and controlled charging and discharging is performed by the battery control block 7.

For security reasons, it may sometimes be necessary to completely disconnect the electric energy source 1. It may also be necessary to regulate its power. From time to time it is also necessary to transform electric energy source 1 voltage into voltage usable for connecting load 6. For this purpose, it is advantageous to insert between the electric energy source 1 and the inverter 4 a power-connected DC/DC converter 3. This DC/DC converter 3 is also data-connected to the PLC control system 11.

The function of the DC/DC converter 3 is as follows:

To the DC/DC converter 3 input, DC voltage is supplied from the electric energy source 1, i.e. for example in the case of a solar power source, from photovoltaic panels 1.1, 1.2, 1.3 which are connected in serial sections. The DC/DC converter 3 transfers this energy to its first converter output 3.1, through which it supplies the inverter 4 input, including the load 6. If the energy supplied from the electric energy source 1 is greater than the consumption of the load 6, a surplus of electric energy arises which the DC/DC converter 3 transfers to its second converter output 3.2, through which it will power the battery control block 7 and battery module 8, if the device is equipped by a branch with battery modules 8. Everything is controlled by the PLC control system 11 which has information about the electric energy source 1. For photovoltaic panels 1.1, 1.2, 1.3 with installed power optimizers 2.1, 2.2, 2.3 described below, it then has information about each single photovoltaic panel 1.1, 1.2, 1.3 The PLC control system 11 additionally has information on the consumption of the load 6 from the measuring module 9 and controls both outputs 3.1 and 3.2 of the DC/DC converter 3, powering respectively in the given order the inverter 4 input and the battery module 8 input through the battery control block 7.

If the power drawn from the inverter 4 is greater than the power produced by the renewable electric energy source 1, the battery bank composed of battery modules 8 directly powers the DC/DC converter 3. If the battery modules 8 are charged to 100%, or are not at all present in the device and no other regulation is possible, e.g. in the form of water heating, powering a heat pump, or similar, the DC/DC converter 3 will ensure power limitation on the side of the electric energy source 1.

When activating the emergency stop function, described in more detail hereinafter, the PLC control system 11 sends a signal to the DC/DC converter 3 which then disconnects the electric energy source 1 and also the second converter output 3.2 to the battery module 8 and the first converter output 3.1 to the inverter 4. This ensures a safe disconnection.

The DC/DC converter 3 may, if the renewable electric energy source 1 comprises photovoltaic panels 1.1, 1.2, 1.3, function as decreasing/increasing inverter, when the nominal voltage of the string of photovoltaic panels 1.1, 1.2, 1.3, for example 800 V DC or as a maximum 1000 V DC, is transformed to a lower voltage value within the range of 100-350 V DC using semiconductor elements.

The DC/DC converter 3 also regulates voltage at its first converter output 3.1 and feeds the inverter 4 input (typically 300 V), and its second converter output 3.2, and feeds the battery control block 7 input (typically 48 V).

However, the DC/DC converter 3 may work also in a device that does not have battery modules 8 and battery control blocks 7.

In one possible configuration, the electric energy source 1 comprises at least one photovoltaic panel; in FIG. 1, three photovoltaic panels 1.1, 1.2, 1.3 are shown as an example. Commonly, for small solar power stations, to which the invention is not limited, the number of panels may be of the order from one to several tens.

In one preferred embodiment, each photovoltaic panel 1.1, 1.2, 1.3 is then equipped with its dedicated power optimizer 2.1, 2.2, 2.3 for individual status monitoring and/or power control and/or disconnection of the respective photovoltaic panel 1.1, 1.2, 1.3 in the event of damage or fire. Each of these power optimizers 2.1, 2.2, 2.3 is then data-connected to the PLC control system 11.

As a result of this interconnection and the interconnections described above and demonstrated in FIG. 1, an individual monitoring of each photovoltaic panel, 1.1, 1.2, 1.3 is possible. Power optimizers 2.1, 2.2, 2.3 use the function of maximum power point monitoring, or MPP control (Maximum Power Point control) at the level of photovoltaic panels 1.1, 1.2, 1.3. This regulation allows for extraction of maximum power from the solar panels. Each optimizer 2.1, 2.2, 2.3 includes its own MPP regulator. The MPP regulator functions as an inverter, i.e. it can process with high efficiency higher input voltage and a lower current into lower voltage and higher current. Each optimizer 2.1, 2.2, 2.3 has at its input the voltage from its respective photovoltaic panel 1.1, 1.2, 1.3 (about 40 V, depending on the power of photovoltaic panels) and at its output constant voltage according to the current-voltage curve of the MPP controller. This constant voltage is summed up according to the number of power optimizers 2.1, 2.2, 2.3 into the voltage that will power the input of the DC/DC converter 3, which may be e.g. 550 V.

Using the optimizers 2.1, 2.2, 2.3, information is continuously collected and recorded on the power of each photovoltaic panel 1.1, 1.2, 1.3 and its condition, therefore rapid identification of problems and defects is possible. Communication takes place simultaneously on DC wires between the photovoltaic panels 1.1, 1.2, 1.3 and the DC/DC converter 3. Information about the status of each photovoltaic panel 1.1, 1.2, 1.3 may be displayed on an LCD panel, which is installed in one advantageous configuration on inverter 4.

As a result of the installation of the power optimizers 2.1, 2.2, 2.3, it is also possible to combine different powers of the individual photovoltaic panels 1.1, 1.2, 1.3 in the renewable electric energy source 1, and/or to combine photovoltaic panels 1.1, 1.2, 1.3 from different manufacturers, while maintaining constant voltage in the entire loop, which is also called a string, of serially interconnected panels 1.1, 1.2, 1.3. For the same reason, because of the optimizer installation, photovoltaic panels 1.1, 1.2, 1.3 may also be positioned with different geographical orientation or in different areas of the roof with different lighting or shading. The power optimizers 2.1, 2.2, 2.3 will prevent power balancing between differently illuminated panels. Upon evaluation by the PLC control system 11, it is also possible to individually automatically disconnect any of the photovoltaic panels 1.1, 1.2, 1.3 with potentially diagnosed damage, without compromising the functionality of the rest of the system. The installation of power optimizers 2.1, 2.2, 2.3 significantly contributes to better maintenance, protects and improves return on investment and reduces losses caused by panel degradation.

Fire safety and safe installation are also addressed. The risk of electric shock during maintenance, fire, etc. is eliminated by switching to safe touch voltage using the emergency stop button, which is located at an accessible location. After pressing the emergency stop, a signal is applied to the binary input of the PLC control system 11, which evaluates it and executes software disconnection of all power components AC and DC, including photovoltaic panels 1.1, 1.2, 1.3 using optimizers 2.1, 2.2, 2.3. The disconnection is carried out through the PLC communication interface.

Optimizers 2.1, 2.2, 2.3 also prevent surplus feed into the distribution grid. As a result of the interconnection with the PLC control system 11, they ensure smooth power regulation of photovoltaic panels 1.1, 1.2, 1.3 in periods when the surplus electric energy will have nowhere to go (e.g.: full capacity of the battery bank, minimum consumption in the building, etc.).

The device for optimizing the production, consumption and storage of electricity according to the present invention in the advantageous configuration also comprises a thermal energy accumulation equipment 10, which is power-connected to the distinctive nodal point U1 and data-connected to the PLC control system 11.

Thermal energy storage is often implemented in the form of water heating. Thermal energy accumulation equipment 10 is equipped with a PWM control (Pulse Width Modulation control). The equipment 10 has also installed the PWM regulation and IGBT transistors, serving for continuous control of resistive loads of up to the power of 3×2 kW. Continuous regulation is based on the magnitude of surplus fed into the distribution grid and the predefined priorities. The PWM control principle involves a continuous control of the appliance's alternating power using PWM and a sine filter in each phase independently with a continuous appliance power increase and decrease in the range of 0-100%. The setting of the power value and the power change speed is based on the magnitude of surplus fed into the distribution grid and the predefined priorities.

In one preferred embodiment, the PLC control system 11 has seven internal communications and five external communications. Of the 7 internal communication interfaces, the first one is used for communication with the power optimizers 2.1, 2.2, 2.3, the second one for communication with the DC/DC converter 3, the third one for communication with the inverter 4, the fourth one for communication with the inter-phase power transfer module 5, the fifth one for communication with the battery control block 7, the sixth one for communication with the measuring module 9, and the seventh one for the communication with thermal energy accumulation equipment 10. With the help of the data interconnection of the components with the PLC control system 11, as provided in this paragraph, and the previously described power interconnections, a harmonious synergy of all system functions is produced, see also the illustration of these interconnections in FIG. 1.

Five additional communication interfaces are used in the preferred embodiment for external communication with a heat pump, air conditioning, heat recuperation, recharging station and wireless connection.

The PLC control system 11 is further provided in the advantageous configuration with two binary inputs, one for the low tariff electricity signal, the second one for emergency stop.

After activating the emergency stop, all live parts of the device scale down to a safe touch voltage.

Upon activation of the low tariff, the battery bank may be charged, and peak consumption within the building, peak power demand of the heat pump or air conditioning unit, and peak power demand of the fast charging station may be covered.

The PLC control system 11 in the advantageous configuration also has 3 binary outputs: programmable contacts AUX 1, 2, 3.

The AUX outputs are typically freely programmable. In the exemplary configuration the three following outputs are used: AUX1, AUX2 and AUX3. When the output signal AUX1 is activated, including its wiring, large load appliances may be switched off. When the output signal AUX2 is activated, including its wiring, alarm messaging can be switched (e.g.: full discharge or overcharge of a battery bank, or different malfunction conditions). The AUX 3 output signal is freely programmable.

The PLC control system 11 internally combines these communication protocols:

Communication protocol of the power optimizers 2.1, 2.2, 2.3 for monitoring, diagnostics, service messages, emergency stop, power control of photovoltaic panels 1.1, 1.2, 1.3

Communication protocol of the DC/DC converter 3 for monitoring, diagnostics, service messages, emergency stop, control DC voltage Communication protocol of the inverter 4 for monitoring, diagnostics, service messages, emergency stop, power control Communication protocol for the inter-phase power transfer module 5 comprising monitoring, diagnostics, service messages, emergency stop, phase control Communication protocol for the battery control block 7 comprising monitoring, diagnostics, service messages, emergency stop, charging and discharging control, disconnecting a defective battery module 8

Communication protocol for the measuring module 9 for monitoring the consumed and supplied power Communication protocol for the thermal energy accumulation equipment 10 comprising control of resistive loads, typically 3×2 kW Communication protocol for thermal pump power control Communication protocol for air conditioner power control Communication protocol for power control of electric vehicle fast charging stations Communication protocol for the control of pre-defined appliances by means of a wireless network Communication protocol for the heat recuperation Communication protocol for controlling the switching of parts of the system under voltage to a safe touch voltage Communication protocol for the low tariff signal, comprising management of pre-defined priorities of the device Communication protocols for programmable outputs AUX—control of output contact AUX 1 (appliances blocking), AUX 2 (alarm), AUX 3 (freely programmable)

As stated above, the PLC control system 11 may be equipped with a communication interface for the power control of a heat pump, air conditioning unit and a heat recuperation unit. The power control occurs by the means of inverters fitted to all said elements, i.e. including the heat pump, air conditioning unit and heat recuperation unit. The regulation is implemented on the basis of instructions from the control units of the heat pump, air conditioning unit and heat recuperation unit, the magnitude of surplus fed into the grid, and the predefined priorities. The heat pump, the air conditioning unit or the heat recuperation unit primarily draw electric energy from the inverter 4. To cover power peaks, electric energy from the local distribution grid will be used, in particular during low tariff signal.

The PLC control system 11 can further be equipped with a communication interface for controlling the power of an electric vehicle fast charging station. Charging control is based on the actual power delivered by the electric energy source 1, surplus fed to the distribution grid, capacity magnitude of the battery bank encompassing battery modules 8 or the predefined priorities. The fast charging station primarily draws electric energy from inverter 4. To cover the peak power, the electric energy is provided from the local distribution grid, in particular during the low tariff signal.

The PLC control system 11 may also be equipped with a wireless communication interface for remote switching/controlling of appliances (e.g. heaters, heating ladders and similar).

The PLC control system 11 in one advantageous configuration is also equipped with a main LCD display.

The device according to the present invention thus provides a complex solution for the efficient utilization of energy from renewable sources as well as from conventional fuel sources producing energy independently of the distribution grid.

Various types of renewable and non-renewable electric energy sources 1 may be combined. Typical examples are rooftop photovoltaic panels, e.g. on a family house. The output energy is optimized. The power and characteristics of each source element may be monitored, and constant voltage may be maintained in the string of renewable electric energy source 1 elements. Based on the consumed power of the load 6 in phases L1, L2, L3, the output supplied by the inter-phase power transfer module 5 is adjusted so that the supplied power in each phase L1, L2, L3 reflects the consumed one. The power generated is consumed directly in the given building and the surplus is stored in the battery bank with the battery modules 8. If the energy surplus is greater than the capacity of the battery bank, the energy is directed to the thermal energy accumulation equipment 10, or potentially to other devices interconnected by means of the interface for external communication, as stated above, e.g. a heat pump, air conditioning and others. Only in an extreme case, when all these possibilities of consumption or storing energy on site have been exhausted, the surplus is fed through the distribution board 12 to the distribution grid.

Electrical appliances in the given building, in other words the load 6, always first draw energy from the renewable electric energy source 1 and then from the battery bank with battery modules 8.

If the energy produced from the electric energy source 1 or energy from the battery modules 8 is insufficient, electric energy is drawn from the distribution board 12 of the distribution grid.

The device according to the present invention makes it possible to continuously control the resistive load of water heating (e.g. an accumulation tank, boiler), control the inverter power of a heat pump, control the inverter power of an air conditioner unit, control power of an electric vehicle fast charging station, or remote switching of electric household appliances using a wireless network.

INDUSTRIAL APPLICABILITY

The device according to the present invention provides a complex solution for optimizing production, consumption, and storage of electric energy from renewable sources as well as from conventional fuel sources, producing energy independently of the public distribution grid. It can be used wherever it is necessary to effectively manage the energy produced, in particular to solve the problem of uneven distribution of the power used by the load in phases L1, L2, L3. Also, the system was designed for the effective management of surplus energy and respectively its consumption back from the grid, when the source power decreases.

The invention claimed is:

1. A device for optimizing production, consumption and storage of electric energy from renewable energy sources or conventional fuel sources, wherein the device is connected to a load and includes:
    an electric energy source to which a hybrid or grid inverter is power-connected by its input terminal, the inverter output being three-phase with symmetrical power distribution uniform in all three phases;
    a measuring module for measuring supplied power and power consumed by the load individually, in each of the three phases separately;
    an inter-phase power transfer module and a PLC control system, the inter-phase power transfer module being power-connected directly to the inverter output by its input directly or by means of other components and comprises at least one first power board including at least three power transistors for controlling the power, with at least one power transistor being connected to each of the three phases and further, the inter-phase power transfer module has a data interface and has a first output with asymmetrical power distribution into the three phases, wherein this first output is further connected to a distinctive nodal point, this distinctive nodal point being power-connected to the load and also power-connected to the measuring module, which is further data connected to the PLC control system, wherein this PLC control system is also data connected in one additional branch to the data interface of the inter-phase power transfer module, and in second additional branch to the inverter.

2. The device for optimizing production, consumption and storage of electric energy according to claim 1, wherein the inter-phase power transfer module includes power IGBT transistors.

3. The device for optimizing production, consumption and storage of electric energy according to claim 1 further including at least one battery module with at least one upstream battery control block;
    and wherein the inter-phase power transfer module has also a second output with an upstream AC/DC converter, and this second output is power-connected through the battery control block to the battery module, the battery control block being additionally data-connected to the PLC control system.

4. The device for optimizing production, consumption and storage of electric energy according to claim 3, wherein the battery control block comprises an active balancer that includes:
  a second power board with installed:
    power transistors;
    coupling transformer;
    power ballast;
    switching mode power supply;
    measuring circuits for measuring current, voltage, insulation and temperature; and
  a battery communication module for the connection to the PLC control system and for the battery module data recording.

5. The device for optimizing production, consumption and storage of electric energy according to claim 3 further comprising a DC/DC converter for disconnecting the electric energy source and for its power control and for transformation of voltage from the electric energy source, this DC/DC converter being inserted in the circuit between the electric energy source and the inverter and is power-connected with them, this DC/DC converter being further data-connected to the PLC control system.

6. The device for optimizing production, consumption and storage of electric energy according to claim 5, wherein the DC/DC converter is power-connected also to the battery control block.

7. The device for optimizing production, consumption and storage of electric energy according to claim 1, further comprising a DC/DC converter for disconnecting the electric energy source and for its power control and for transformation of voltage from the electric energy source, this DC/DC converter being inserted in the circuit between the electric energy source and inverter and is power-connected with them, and this DC/DC converter being further data-connected to the PLC control system.

8. The device for optimizing production, consumption and storage of electric energy according to of claim 1 which is power-connected to a distribution board of a distribution grid, the connection being made through the distinctive nodal point.

9. The device for optimizing production, consumption and storage of electric energy according to claim 1, wherein the electric energy source comprises at least one photovoltaic panel.

10. The device for optimizing production, consumption and storage of electric energy according to claim 9, wherein each photovoltaic panel has a dedicated power optimizer installed for individual status monitoring and/or power control and/or disconnection of the respective photovoltaic panel in case of damage or fire, wherein each power optimizer is data-connected to the PLC control system.

11. The device for optimizing production, consumption and storage of electric energy according to claim 1, including a thermal energy accumulation equipment for accumulation of thermal energy, which is power-connected to the distinctive nodal point and is data-connected to the PLC control system.

* * * * *